(12) United States Patent
Imayama (10) Patent No.: US 7,479,832 B2
(45) Date of Patent: Jan. 20, 2009

(54) DIFFERENTIAL AMPLIFYING SYSTEM

(75) Inventor: Teruo Imayama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 170 days.

(21) Appl. No.: 11/672,215

(22) Filed: Feb. 7, 2007

(65) Prior Publication Data

US 2007/0182488 A1     Aug. 9, 2007

(30) Foreign Application Priority Data

Feb. 8, 2006     (JP) ............................. 2006-031421

(51) Int. Cl.
*H03F 3/45* (2006.01)
*H03G 3/20* (2006.01)

(52) U.S. Cl. ...................... 330/257; 330/136

(58) Field of Classification Search ................. 330/136, 330/140, 251–262, 285
See application file for complete search history.

(56) References Cited

U.S. PATENT DOCUMENTS 5,136,259 A     8/1992 Sato et al.

2006/0077004 A1     4/2006 Groe

FOREIGN PATENT DOCUMENTS

| JP | 2003-324323 | | 11/2003 |
|---|---|---|---|
| JP | 2004072250 A | * | 3/2004 |

* cited by examiner

*Primary Examiner*—Robert Pascal
*Assistant Examiner*—Khiem D Nguyen
(74) *Attorney, Agent, or Firm*—Oblon, Spivak, McClelland, Maier & Neustadt, P.C.

(57) ABSTRACT

A differential amplifying system has a differential amplifier for amplifying a voltage signal inputted from an input terminal and outputting the amplified voltage signal through an output terminal; an amplitude detection circuit for detecting an amplitude of said voltage signal inputted to said differential amplifier and outputting a detected current corresponding to the amplitude; a compensation circuit having: a current mirror circuit for outputting a compensating current at a desired mirror ratio for an input of said detected current; and a feedback circuit for changing a mirror ratio of said current mirror circuit in order to control a magnitude of the compensating current according to an amplitude of the voltage signal detected by said amplitude detection circuit; and a bias circuit for supplying bias voltage to said differential amplifier in order to add a bias value to inputted said voltage signal based on the magnitude of said compensating current.

9 Claims, 6 Drawing Sheets

DIFFERENTIAL AMPLIFYING SYSTEM

CROSS-REFERENCE TO RELATED APPLICATIONS

This application is based upon and claims the benefit of priority from the prior Japanese Patent Application No. 2006-31421, filed on Feb. 8, 2006, the entire contents of which are incorporated herein by reference.

BACKGROUND OF THE INVENTION

1. Field of the Invention

The present invention relates, for example, to a high-frequency differential amplifying system used for a mobile communications terminal.

2. Background Art

Recently, high performance of mobile communications terminals, such as cellular phones, necessitates increase in the electrical power consumption of parts other than the high-frequency parts, and a longer duration of call is required. Therefore, there has been an increasing demand, for example, for decreasing electrical power consumption in a high-frequency differential amplifying system used for a transmission part of a mobile communications terminal.

Generally, a differential amplifying system handling high frequency and a large amount of power is made up of a bias circuit and a differential amplifier and a load. In particular, in a differential amplifying system requiring low-distortion characteristics, bias voltage to be supplied to the differential amplifier for performing power amplification is fixed, and the bias voltage is determined so as to ensure linearity when signal amplitude is large. Accordingly, there has been a problem that large electrical power is consumed even when the signal amplitude is small, and thus that low electrical power consumption cannot be achieved.

Some conventional differential amplifying system intending to reduce electrical power consumption use a configuration, for example, in which an input power detection circuit consisting of a detector circuit and a low-pass filter is connected to the midst of a two-state amplifier circuit having a first-stage amplifier circuit and a final-stage amplifier circuit, through a series circuit consisting of a capacitor and a resistor, and in which the output of the input power detection circuit is compared in a comparator with a reference voltage and the resultant signal is used for two-stage variation of the bias current of the final-stage amplifier (e.g., Japanese Patent Laid-Open No. 2003-324323).

This differential amplifying system serves for reducing consumption of current in the final-stage amplifier circuit by changing the bias current.

However, in the conventional differential amplifying system mentioned above, if distortion is desired to be equal throughout a wide output signal range, for example, a plurality of bias circuits are required to be provided, which may raise a problem of making the circuit configuration complicated. In addition, at the timing when the bias voltage is outputted from each of the bias circuits, the bias current is drastically changed to deteriorate the distortion characteristics, which may raise a problem of significantly reducing efficiency when the bias current is changed.

SUMMARY OF THE INVENTION

According one aspect of the present invention, there is provided: a differential amplifying system comprising a differential amplifier for amplifying a voltage signal inputted from an input terminal and outputting the amplified voltage signal through an output terminal; an amplitude detection circuit for detecting an amplitude of said voltage signal inputted to said differential amplifier and outputting a detected current corresponding to the amplitude; a compensation circuit having: a current mirror circuit for outputting a compensating current at a desired mirror ratio for an input of said detected current; and a feedback circuit for changing a mirror ratio of said current mirror circuit in order to control a magnitude of the compensating current according to an amplitude of the voltage signal detected by said amplitude detection circuit; and a bias circuit for supplying bias voltage to said differential amplifier in order to add a bias value to inputted said voltage signal based on the magnitude of said compensating current.

DETAILED DESCRIPTION

For example, in a differential amplifying system associated with an aspect of the present invention, bias voltage is supplied to a differential amplifier for amplifying power in order to attain low-distortion characteristics, and then the bias voltage is changed so that the current consumption in the differential amplifier is reduced, while maintaining the linearity being in accord with the amplitude of inputted signals.

Hereinafter are now described some embodiments of the present invention with reference to the accompanying drawings

FIRST EMBODIMENT

Figure 1:
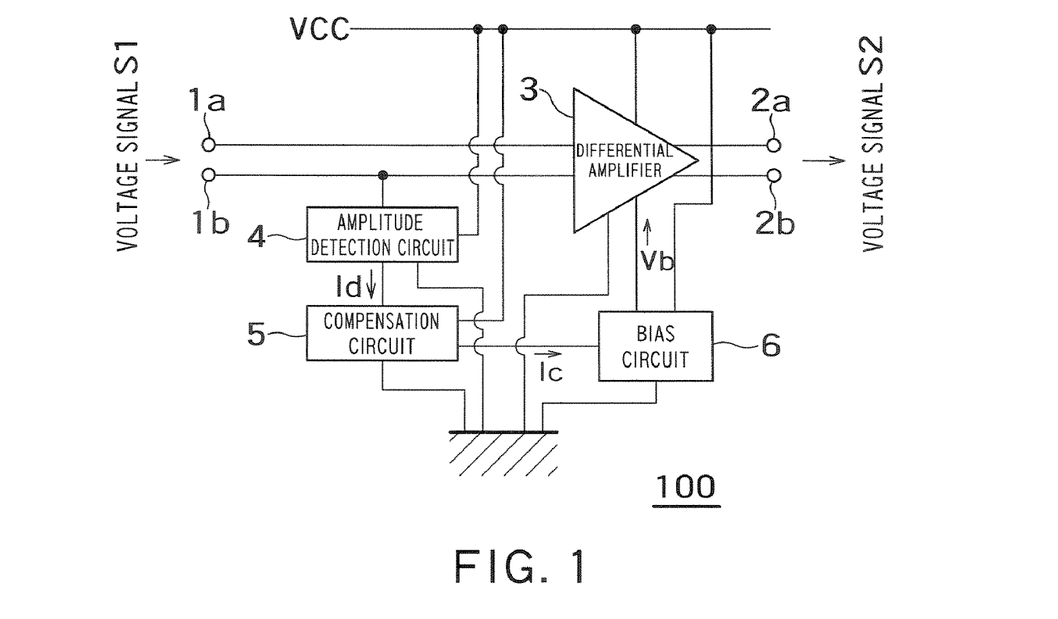
FIG. 1 is a block diagram illustrating a configuration of a principal part of a differential amplifying system according to a first embodiment, or an aspect, of the present invention.

FIG. 1 is a block diagram illustrating a configuration of a principal part of a differential amplifying system according to a first embodiment, or an aspect, of the present invention.

As shown in FIG. 1, a differential amplifying system 100 is provided with: a differential amplifier 3 which amplifies a voltage signal S1 inputted from input terminals 1a and 1b and outputs an amplified voltage signal S2 through output terminals 2a and 2b; and an amplitude detection circuit 4 which detects amplitude of the voltage signal S1 to be inputted to the differential amplifier 3 and outputs a detected current Id corresponding to the detected amplitude.

The differential amplifying system 100 is also provided with: a compensation circuit 5 which outputs a compensating current Ic at a desired mirror ratio for the input of the detected current Id and changes the mirror ratio so as to control magnitude of the compensating current Ic according to the amplitude of the voltage signal S1 detected by the amplitude detection circuit 4; and a bias circuit 6 which supplies a bias voltage Vb to the differential amplifier 3 in order to perform addition of a bias value to the inputted voltage signal S1 based on the magnitude of the compensating current Ic.

The following is a description for the case where bipolar transistors are used in the individual configurations of the differential amplifying system 100.

Figure 2:
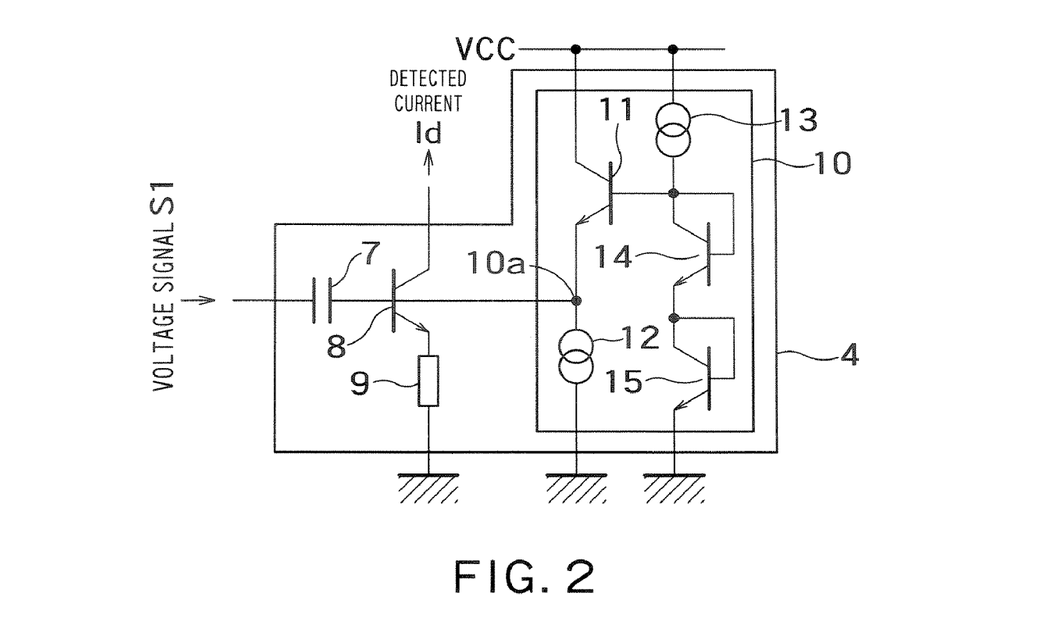
FIG. 2 is a circuit diagram illustrating the amplitude detection circuit of the differential amplifying system according to the first embodiment, or an aspect, of the present invention.

FIG. 2 is a circuit diagram illustrating the amplitude detection circuit 4 of the differential amplifying system 100 according to the first embodiment, or an aspect, of the present invention.

As shown in FIG. 2, the amplitude detection circuit 4 includes a DC cut capacitor 7 connected to the input terminal 1b, an NPN-type detection transistor 8 whose base is connected to the DC cut capacitor 7, a resistor 9 connected between an emitter of the detection transistor 8 and a ground voltage, and a bias unit 10 for biasing the detection transistor 8.

The bias unit 10 includes an NPN-type bipolar transistor 11 whose collector is connected to a power source voltage VCC and whose emitter is connected to a bias terminal 10a for biasing the detection transistor 8, a constant current source 12 connected between the bias terminal 10a and the ground voltage, and a constant current source 13 connected between the power source voltage VCC and a base of the bipolar transistor 11.

The bias unit 10 also includes an NPN-type bipolar transistor 14 whose collector and base are connected to the base of the bipolar transistor 11, and an NPN-type bipolar transistor 15 whose collector and base are connected to the emitter of the bipolar transistor 14 and whose emitter is connected to the ground voltage.

Hereinafter is described an operation of the amplitude detection circuit 4 for detecting the voltage signal S1.

The voltage signal S1 inputted to the input terminal 1b is inputted to the base of the detection transistor 8 through the DC cut capacitor 7. Since the base of the detection transistor 8 is being biased by the emitter of the transistor 11, base voltage of the detection transistor 8 is maintained at substantially a constant level by the emitter of the transistor 11. Thus, reduction in the base voltage of the detection transistor 8 is limited.

As a result, an average voltage of the signals inputted to the base of the detection transistor 8 is raised. In other words, as the signal amplitude of the voltage signal S1 increases, the average voltage of base voltage signals of the detection transistor 8 is raised.

In this way, the detection transistor 8 detects the voltage signal S1 and outputs current corresponding to the amplitude of the signal as the detected current Id, which is the output of the amplitude detection circuit 4, from the collector to the compensation circuit 5.

Figure 3:
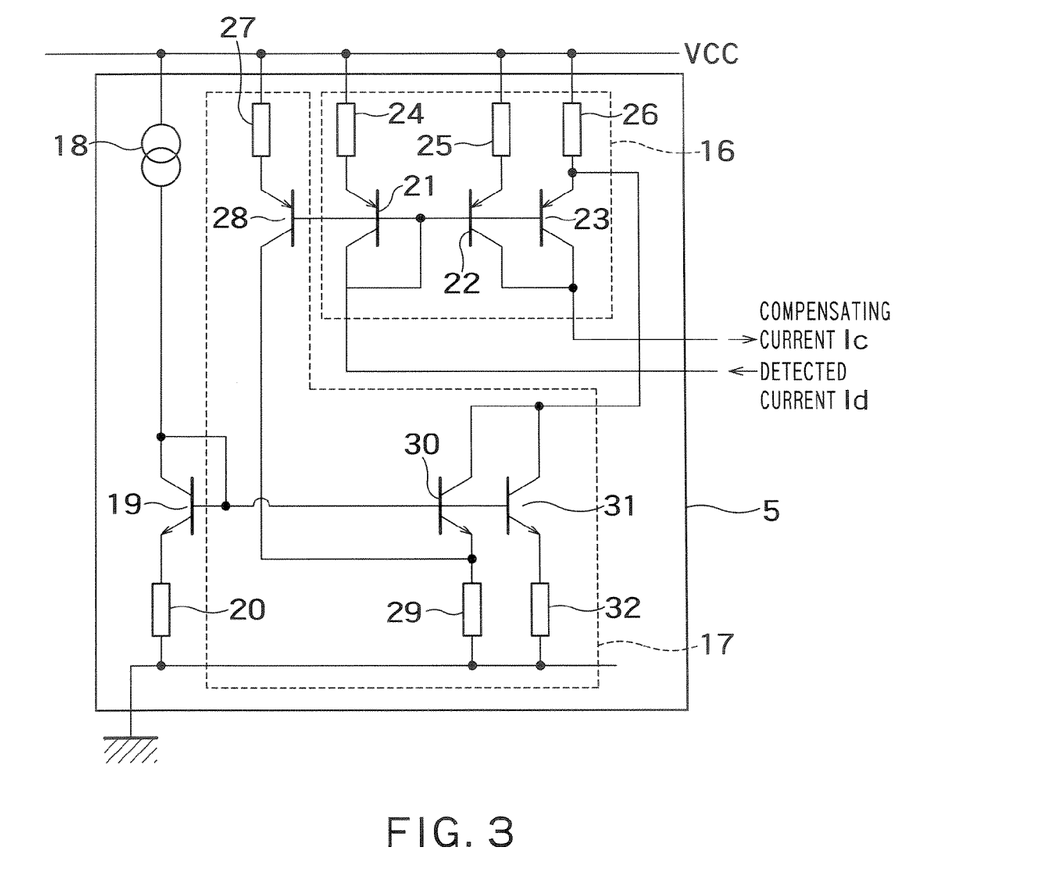
FIG. 3 is a circuit diagram illustrating the compensation circuit of the differential amplifying system according to the first embodiment, or an aspect, of the present invention.

FIG. 3 is a circuit diagram illustrating the compensation circuit 5 of the differential amplifying system 100 according to the first embodiment, or an aspect, of the present invention.

As shown in FIG. 3, the compensation circuit 5 includes a current mirror circuit 16 for outputting the compensating current Ic at a desired mirror ratio (which is determined by a first mirror ratio and a second mirror ratio) for the input of the detected current Id, a feedback circuit 17 for changing the mirror ratio of the current mirror circuit 16 in order to control the magnitude of the compensating current Ic in accordance with the amplitude of the voltage signal S1 detected by the amplitude detection circuit 4, a constant current source 18 connected to the power source voltage VCC, an NPN-type bipolar transistor 19 whose collector and base are connected to the constant current source 18, and a resistor 20 connected between an emitter of the bipolar transistor 19 and the ground voltage.

The current mirror circuit 16 includes a first PNP-type bipolar transistor 21 whose collector and base are inputted with the detected current Id (i.e., whose collector and base are connected to the collector of the detection transistor 8), and a second PNP-type bipolar transistor 22 whose base is connected to the first bipolar transistor 21 and through which current flows at a first mirror ratio with respect to current flowing through the first bipolar transistor 21.

The current mirror circuit 16 also includes a third bipolar transistor 23 whose base is connected to the first bipolar transistor 21 and through which current flows at a second mirror ratio with respect to the current flowing through the first bipolar transistor 21, a resistor 24 connected between the power source voltage VCC and an emitter of the first bipolar transistor 21, a resistor 25 connected between the power source voltage VCC and an emitter of the second bipolar transistor 22, and a resistor 26 connected between the power source voltage VCC and an emitter of the third bipolar transistor 23.

The current mirror circuit 16 outputs the compensating current Ic including the currents flowing through the respective second and third bipolar transistors 22 and 23 at the desired mirror ratios, respectively, with respect to the input of the detected current Id.

The feedback circuit 17 includes a resistor 27 connected to the power source voltage VCC, and a PNP-type bipolar transistor 28 whose emitter is connected to the resistor 27 and whose base is connected to the base of the first bipolar transistor 21.

The feedback circuit 17 also includes a resistor 29 connected between a collector of the bipolar transistor 28 and the ground voltage, and an NPN-type bipolar transistor 30 whose emitter is connected to the resistor 29, whose base is connected to the base of the bipolar transistor 19 and whose collector is connected to the emitter of the third bipolar transistor 23.

The feedback circuit 17 further includes an NPN-type bipolar transistor 31 whose base is connected to the base of the bipolar transistor 30 and whose collector is connected to the emitter of the third bipolar transistor 23, and a resistor 32 connected between the bipolar transistor 31 and the ground voltage.

Hereinafter is described in detail an operation in which the compensation circuit 5 having the configuration as described above controls the current that flows through the third bipolar transistor 23 based on the magnitude of the detected current Id.

First, the detected current Id that is a collector current of the detection transistor 8 is inputted to the current mirror circuit 16 of the compensation circuit 5, and then the current mirror circuit 16 removes high frequency signals therefrom to output the compensating current Ic in accordance with a mirror ratio. In case the amplitude of the voltage signal S1 is small and the detected current Id is small, voltage drop at the resistor 26 is so large as to turn off the third bipolar transistor 23. Therefore, the mirror ratio in this case is determined by the first and the second bipolar transistors 21 and 22, and the resistors 24 and 25.

On the other hand, in case the amplitude of the voltage signal S1 is large and the detected current Id is large, a collector current of the bipolar transistor 28 becomes so large as to allow the voltage of the resistor 29 to drop down and to turn off the bipolar transistor 30. As a result, the voltage drop at the resistor 26 is mitigated. In this way, a collector current of the third bipolar transistor 23 is increased, and being added with a collector current of the second bipolar transistor 22, increases the mirror ratio of the current mirror circuit 16.

In other words, when the amplitude of the voltage signal S1 is small (e.g., smaller than an amplitude (reference amplitude) below which distortion characteristics of the differential amplifying system 100 begin deteriorating), the mirror ratio of the current mirror circuit 16 becomes small. Contrarily, when the amplitude of the voltage signal S1 is large (e.g., larger than the reference amplitude), the mirror ratio of the current mirror circuit 16 becomes large. The point of amplitude of the voltage signal S1 at which the mirror ratio is changed, can be controlled with the design of the feedback circuit 17.

For example, the feedback circuit 17 can be designed so that the mirror ratio can be changed at the amplitude of the voltage signal S1 (the reference amplitude mentioned above) which causes deterioration in the linearity of the differential amplifying system 100. Thus, much more compensating current Ic can be supplied to the bias circuit 6 at the point of deterioration in the linearity of the differential amplifying system 100 Accordingly, the distortion of the differential amplifying system 100 after the change of the mirror ratio can be suppressed.

Such a mirror ratio changing point can be provided in plural number, and by designing the feedback circuit 17 in accord with the distortion characteristics required for the differential amplifying system 100, an optimum design for the differential amplifying system 100 becomes possible without uselessly consuming electric power.

Since the change of the mirror ratio of the current mirror circuit 16 is performed by utilizing switching characteristics of the bipolar transistors, the change is smooth without accompanying drastic change in the compensating current Ic.

In addition to the third bipolar transistor 23 which limits the mirror current for the current mirror circuit 16, similar bipolar transistors may be further provided being connected in parallel, so that changes to the plurality of mirror ratios may be achieved.

As described above, the feedback circuit 17, when inputted with the detected current Id corresponding to the amplitude of the voltage signal S1, which is smaller than the reference amplitude, for example, changes the mirror ratio of the current mirror circuit 16, or limits the current to be flowed to the third bipolar transistor 23 to limit the compensating current Ic.

Figure 4:
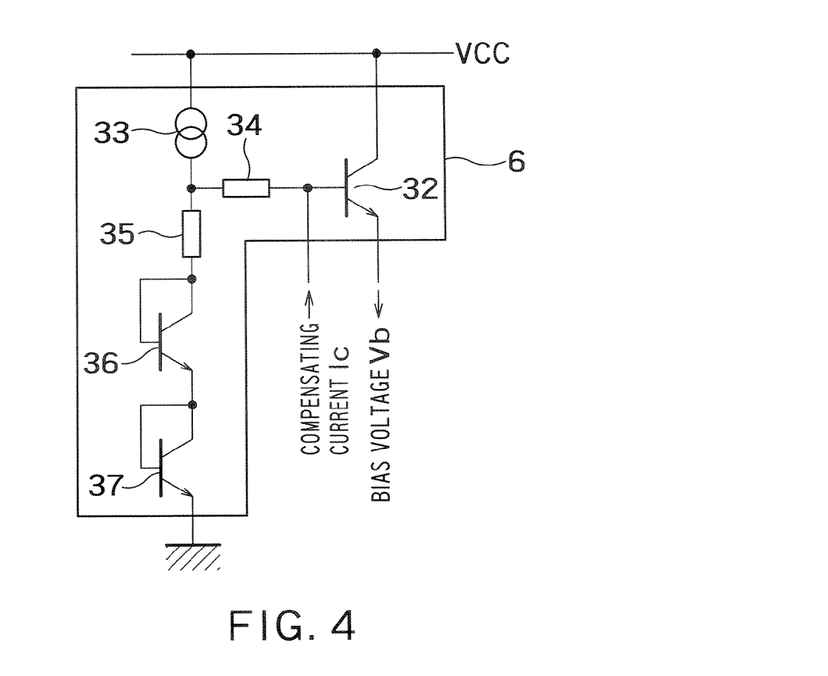
FIG. 4 is a circuit diagram illustrating the bias circuit of the differential amplifying system according to the first embodiment, or an aspect, of the present invention.

FIG. 4 is a circuit diagram illustrating the bias circuit 6 of the differential amplifying system 100 according to the first embodiment, or an aspect, of the present invention.

As shown in FIG. 4, the bias circuit 6 includes an NPN-type bipolar transistor 32 whose collector is connected to the power source voltage VCC, whose base is inputted with the compensating current Ic (or connected to the collector of the second bipolar transistor 22) and through an emitter of which the bias voltage Vb is outputted to the differential amplifier 3, a constant current source 33 connected to the power source voltage VCC, and a resistor 34 connected between the constant current source 33 and the base of the bipolar transistor 32 The bias circuit 6 also includes a resistor 35 connected to the constant current source 33, an NPN-type bipolar transistor 36 whose collector and base are connected to the resistor 35 for diode connection, and an NPN-type bipolar transistor 37 whose collector and base are connected to an emitter of the bipolar transistor 36 for diode connection and whose emitter is connected to the ground voltage.

A base voltage of the bipolar transistor 32 is the sum of the voltage produced by the current from the constant current source 33 and the compensating current Ic, which both flow into the bipolar transistors 36 and 37 and the resistor 35, and the voltage produced by the compensating current Ic which flows into the resistor 34.

When the voltage signal S1 is so large as to increase the compensating current Ic, the voltage produced at the bipolar transistors 36 and 37 barely changes. However, voltage drop at the resistors 34 and 35 becomes large in proportion to the compensating current Ic. As a result, the base voltage of the bipolar transistor 32 is raised in proportion to the compensating current Ic. In other words, when the amplitude of the voltage signal S1 becomes so large as to increase the compensating current Ic, the bias voltage Vb to be supplied to the differential amplifier 3 is raised.

Figure 5:
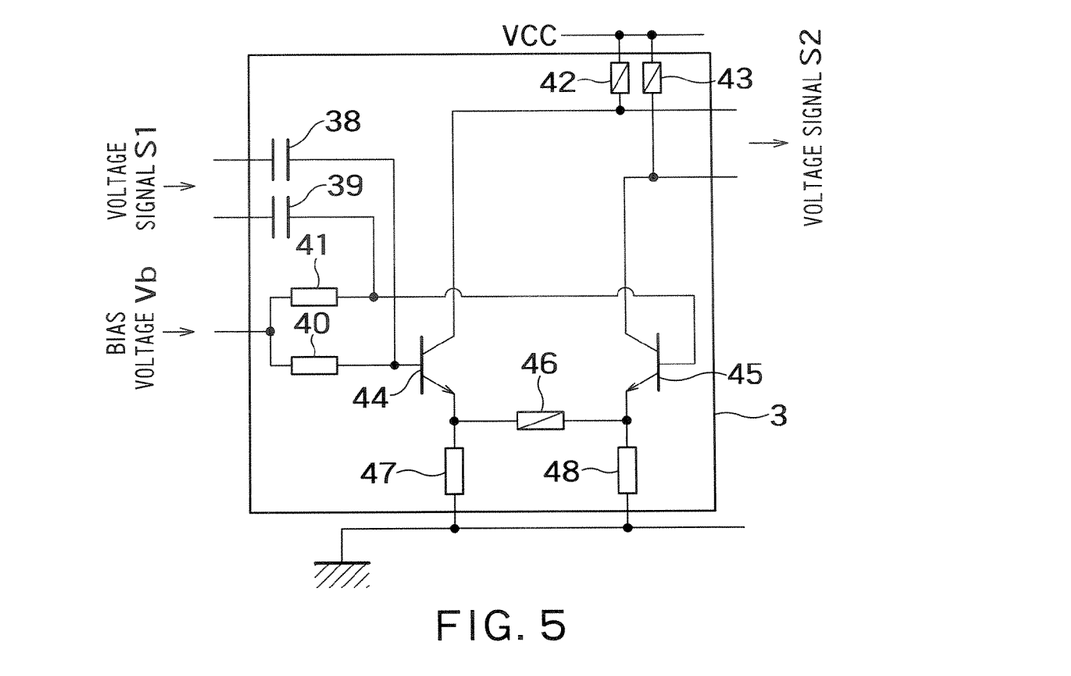
FIG. 5 is a circuit diagram illustrating the differential amplifier of the differential amplifying system according to the first embodiment, or an aspect, of the present invention.

FIG. 5 is a circuit diagram illustrating the differential amplifier 3 of the differential amplifying system 100 according to the first embodiment, or an aspect, of the present invention.

As shown in FIG. 5, the differential amplifier 3 includes DC cut capacitors 38 and 39 connected to the input terminals 1a and 1b, respectively, a feed resistor 40 connected between the DC cut capacitor 38 and an input of the bias voltage Vb (or the emitter of the bipolar transistor 32), a feed resistor 41 connected between the DC cut capacitor 39 and the input of the bias voltage Vb (or the emitter of the bipolar transistor 32), an inductor 42 connected to the power source voltage VCC, an inductor 43 connected to the power source voltage VCC, an NPN-type amplifier transistor 44 whose collector is connected to the inductor 42 and whose base is connected to the resistor 40, an NPN-type amplifier transistor 45 whose collector is connected to the inductor 43 and whose base is connected to the resistor 41, an inductor 46 connected between an emitter of the amplifier transistor 44 and an emitter of the amplifier transistor 45, a bias resistor 47 connected between the emitter of the amplifier transistor 44 and the ground voltage, and a bias resistor 48 connected between the emitter of the amplifier transistor 45 and the ground voltage.

The bias voltage Vb supplied from the bias circuit 6 is supplied to the base voltage of the amplifier transistors 44 and 45 through the feed resistors 40 and 41, respectively. When the compensating current Ic is increased with the increase of the amplitude of the voltage signal S1, base voltages at the respective amplifier transistors 44 and 45 are raised to thereby increase collector currents of the amplifier transistors 44 and 45, that is, idle current of the differential amplifier 3.

In other words, when the bias circuit 6 raises the bias voltage Vb with the increase of the compensating current Ic, the differential amplifier 3 then increases the bias value to be added to the inputted voltage signal with the increase of the bias voltage Vb.

The differential amplifying system 100 having the configuration and function as described above, supplies the bias voltage Vb corresponding to the signal amplitude detected by the amplitude detection circuit 4, to the differential amplifier 3. Further, the differential amplifying system 100 controls the compensating current Ic to be supplied to the bias circuit 6 by changing the current mirror ratio of the current mirror circuit 16, so that the distortion after the change of the mirror ratio can be suppressed.

In this way, the differential amplifying system 100 is enabled to retain high linearity in a large-signal operation while reducing the electrical power consumption.

That is, in a conventional differential amplifying system, a fixed current is consumed for the amplitude of inputted voltage signals, which means that, the same amount of current is consumed for small signal amplitude as in the case of large signal amplitude. Contrarily, in the differential amplifying system 100 according to the present embodiment, it is so arranged that the larger the signal amplitude becomes, the higher the bias voltage Vb to be inputted to the differential amplifier 3 becomes, so that the current at the time of small signal amplitude can be suppressed at a low level.

Further, in the conventional differential amplifying system, as the output amplitude becomes large, the distortion characteristics are deteriorated by a constant fraction. However, with the differential amplifying system 100 according to the present embodiment, the compensating current Ic is increased in the compensation circuit 5 at the timing of deterioration of the distortion characteristics (or at the timing when the signal amplitude becomes larger than the reference amplitude). Therefore, deterioration in the distortion characteristics at the time of large output amplitude is more mitigated compared with the conventional differential amplifying system.

As described above, the differential amplifying system 100 according to the present embodiment can optimize the distortion characteristics of the output signals, while reducing electrical power consumption in the circuit.

It should be appreciated that, in the first embodiment described above, the same effects can be attained by using reverse conductive type bipolar transistors for the respective transistors and by reversing the polarity.

SECOND EMBODIMENT

The first embodiment has presented the configuration in which bipolar transistors are used for the transistors for constructing the current mirror circuit, for example, in the differential amplifying system, however, the configuration may be made, for example, by using transistors such as MOS transistors, compound FETs (field effect transistors) and compound HBTs (hetero junction bipolar transistors).

In the present embodiment, a description will be given on a configuration in which MOS transistors are used for the transistors constructing a current mirror circuit or the like in a differential amplifying system. It should be appreciated that the entire configuration of the differential amplifying system according to the present embodiment is the same as the one illustrated in FIG. 1.

Figure 6:
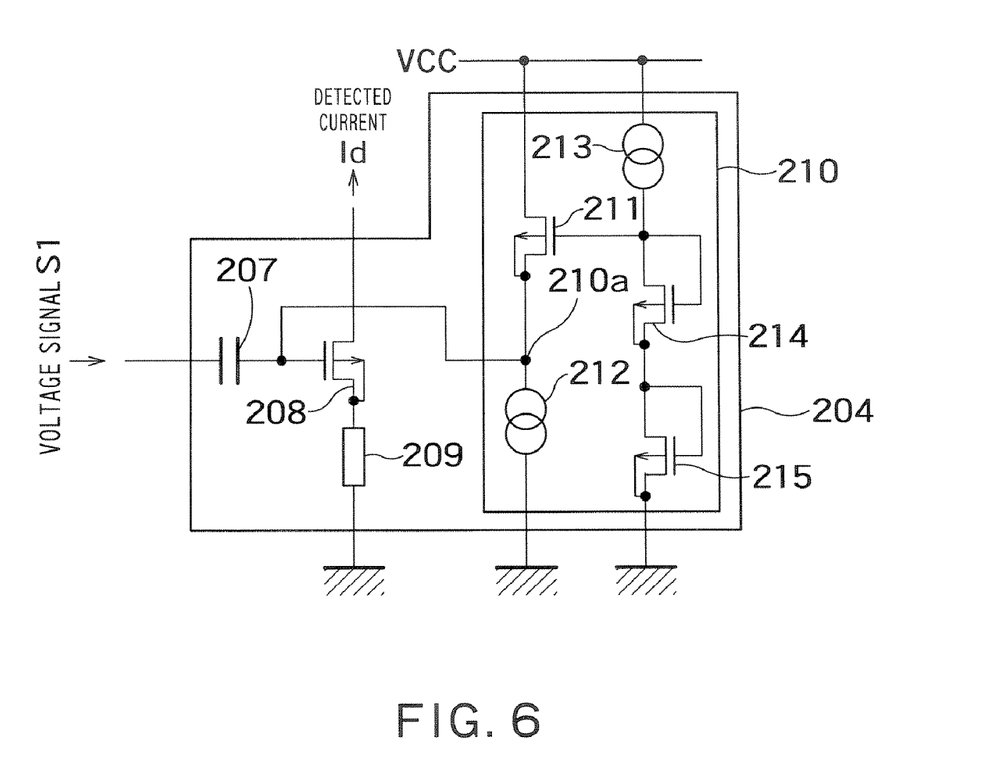
FIG. 6 is a circuit diagram illustrating an amplitude detection circuit of a differential amplifying system according to a second embodiment, or an aspect, of the present invention.

FIG. 6 is a circuit diagram illustrating an amplitude detection circuit of a differential amplifying system according to a second embodiment, or an aspect, of the present invention. It should be appreciated that components designated with the similar references to those in the first embodiment indicate similar components to those in the first embodiment.

As shown in FIG. 6, an amplitude detection circuit 204 includes a DC cut capacitor 207 connected to the input terminal 1b, an n-type MOS detection transistor 208 whose gate is connected to the DC cut capacitor 207, a resistor 209 connected between a source of the n-type MOS detection transistor 208 and the ground voltage, and a bias unit 210 for biasing the n-type MOS detection transistor 208.

The bias unit 210 includes an n-type MOS transistor 211 whose drain is connected to the power source voltage VCC and whose source is connected to a bias terminal 210a for biasing the n-type MOS detection transistor 208, a constant current source 212 connected between the bias terminal 210a and the ground voltage, a constant current source 213 connected between the power source voltage VCC and a gate of the n-type MOS transistor 211, an n-type MOS transistor 214 whose drain and gate are connected to the gate of the n-type MOS transistor 211, and an n-type MOS transistor 215 whose drain and gate are connected to a source of the n-type MOS transistor 214 and whose source is connected to the ground voltage.

The operation for detecting the voltage signal S1 of the amplitude detection circuit 204 is the same as that of the amplitude detection circuit in the first embodiment. That is, the n-type MOS detection transistor 208 detects the voltage signal S1 and outputs from its drain a current corresponding to an amplitude of the signal and serving as the detected current Id, which is an output of the amplitude detection circuit 204, to the compensation circuit 205.

Figure 7:
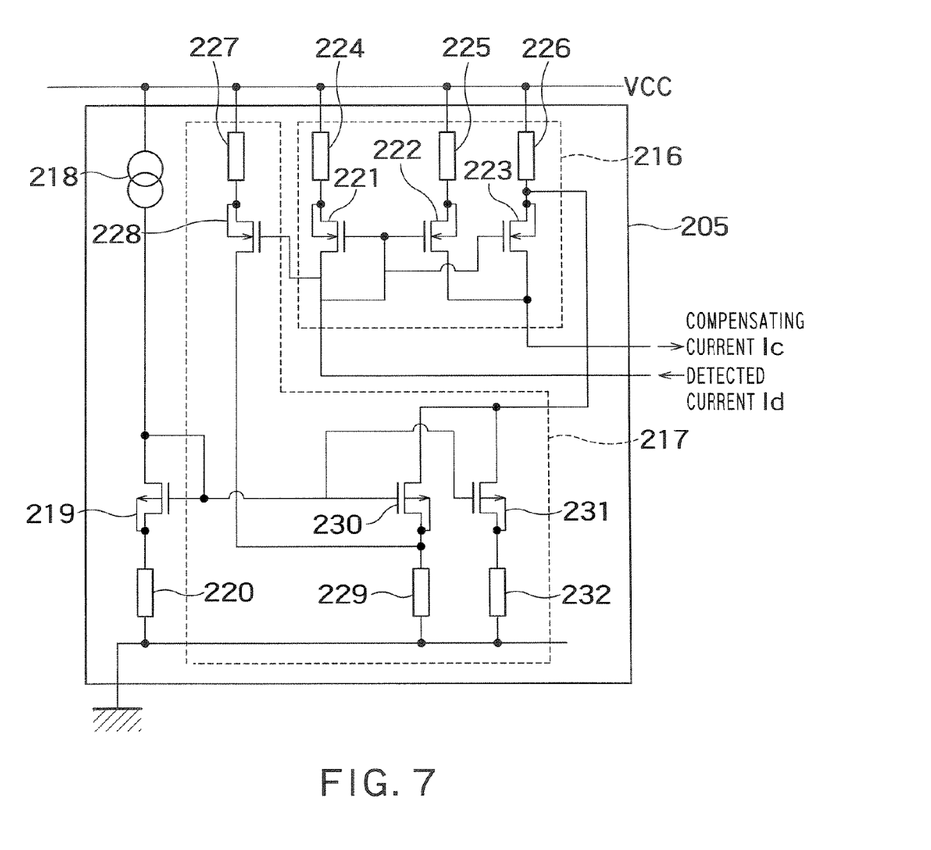
FIG. 7 is a circuit diagram illustrating a compensation circuit of the differential amplifying system according to the second embodiment, or an aspect, of the present invention.

FIG. 7 is a circuit diagram illustrating a compensation circuit of the differential amplifying system according to the second embodiment, or an aspect, of the present invention. It should be appreciated that components designated with the similar references to those in the first embodiment indicate similar components to those in the first embodiment.

As shown in FIG. 7, a compensation circuit 205 includes a current mirror circuit 216 which outputs the compensating current Ic at a desired mirror ratio for the input of the detected current Id, a feedback circuit 217 which changes the mirror ratio of the current mirror circuit 216 in order to control the magnitude of the compensating current Ic in accordance with the amplitude of the voltage signal S1 detected by the amplitude detection circuit 204, a constant current source 218 connected to the power source voltage VCC, an n-type MOS transistor 219 whose drain and gate are connected to the constant current source 218, and a resistor 220 connected between a source of the n-type MOS transistor 219 and the ground voltage.

The current mirror circuit 216 includes a first p-type MOS transistor 221 whose drain and gate are inputted with the detected current Id (or whose drain and gate are connected to a drain of the detection transistor 8), and a second p-type MOS transistor 222 whose gate is connected to the first p-type MOS transistor 221 and through which current flows at a first mirror ratio for current flowing through the first p-type MOS transistor 221.

The current mirror circuit 216 also includes a third p-type MOS transistor 223 whose gate is connected to the first p-type MOS transistor 221 and through which current flows at a second mirror ratio for current flowing through the first p-type MOS transistor 221, a resistor 224 connected between the power source voltage VCC and a source of the first p-type MOS transistor 221, a resistor 225 connected between the power source voltage VCC and a source of the second p-type MOS transistor 222, and a resistor 226 connected between the power source voltage VCC and a source of the third p-type MOS transistor 223.

The current mirror circuit 216 outputs the compensating current Ic including the currents flowing through the second and the third p-type MOS transistors 222 and 223 at a desired mirror ratio for the input of the detected current Id.

The feedback circuit 217 includes a resistor 227 connected to the power source voltage VCC, a p-type MOS transistor 228 whose source is connected to the resistor 227 and whose gate is connected to the gate of the first p-type MOS transistor 221, a resistor 229 connected between a drain of the p-type MOS transistor 228 and the ground voltage, an n-type MOS transistor 230 whose source is connected to the resistor 229, whose gate is connected to the gate of the n-type MOS transistor 219 and whose drain is connected to the source of the third p-type MOS transistor 223, an n-type MOS transistor 231 whose gate is connected to a gate of the n-type MOS transistor 230 and whose drain is connected to the source of the third p-type MOS transistor 223, and a resistor 232 connected between the n-type MOS transistor 231 and the ground voltage.

The operation in which the compensation circuit 205 having the configuration as described above controls current flowing through the third p-type MOS transistor 223 based on the magnitude of the detected current Id, is similar to the operation of the compensation circuit according to the first embodiment.

Specifically, the feedback circuit 217, when inputted with the detected current Id corresponding to an amplitude of the voltage signal S1, which is smaller than the reference amplitude, for example, changes the mirror ratio of the current mirror circuit 216, and limits the current flowing through the third p-type MOS transistor 223 to limit the compensating current Ic.

Figure 8:
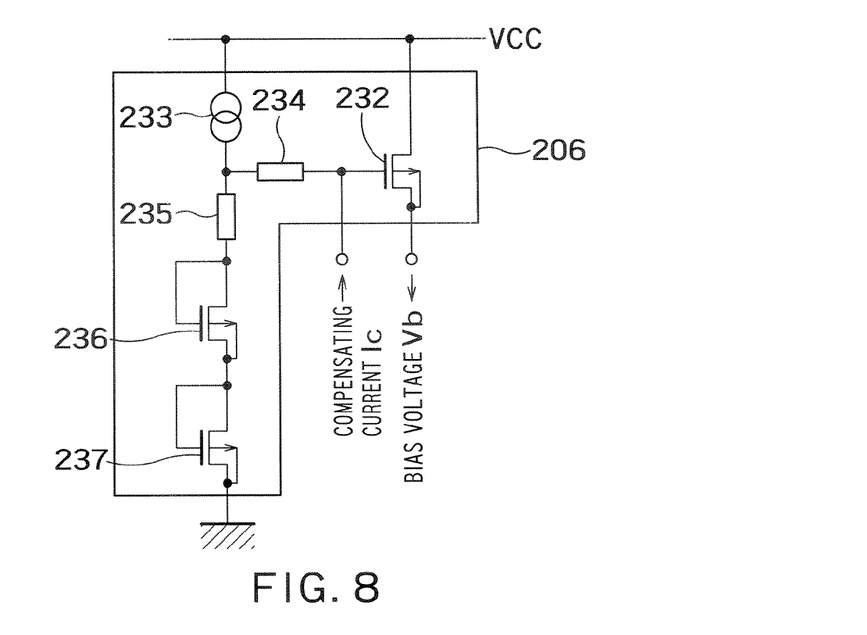
FIG. 8 is a circuit diagram illustrating a bias circuit of the differential amplifying system according to the second embodiment, or an aspect, of the present invention.

FIG. 8 is a circuit diagram illustrating a bias circuit of the differential amplifying system according to the second embodiment, or an aspect, of the present invention. It should be appreciated that components designated with the similar references to those in the first embodiment indicate similar components to those in the first embodiment.

As shown in FIG. 8, the bias circuit 206 includes an n-type MOS transistor 232 whose drain is connected to the power source voltage VCC, whose gate is inputted with the compensating current Ic (or is connected to a drain of the second p-type MOS transistor 222), and through a source of which the bias voltage Vb is outputted to a differential amplifier 203, a constant current source 233 connected to the power source voltage VCC, a resistor 234 connected between the constant current source 233 and the gate of the n-type MOS transistor 232, a resistor 235 connected to the constant current source 233, an n-type MOS transistor 236 whose drain and gate are connected to the resistor 235 for diode connection, and an n-type MOS transistor 237 whose drain and gate are connected to a source of the n-type MOS transistor 236 for diode connection and whose source is connected to the ground voltage.

Gate voltage of the n-type MOS transistor 232 is the sum of the voltage produced by the current from the constant current source 233 and the compensating current Ic, which both flow into the n-type MOS transistors 236 and 237 and the resistor 235, and the voltage produced by the compensating current Ic which flows into the resistor 234.

When the voltage signal S1 is so large as to increase the compensating current Ic, the voltage produced at the n-type MOS transistors 236 and 237 barely changes. However, voltage drop at the resistors 234 and 235 become large in proportion to the compensating current Ic. As a result, the gate voltage of the n-type MOS transistor 232 is raised in proportion to the compensating current Ic. In other words, when the amplitude of the voltage signal S1 becomes so large as to increase the compensating current Ic, the bias voltage Vb to be supplied to the differential amplifier 203 is raised.

Figure 9:
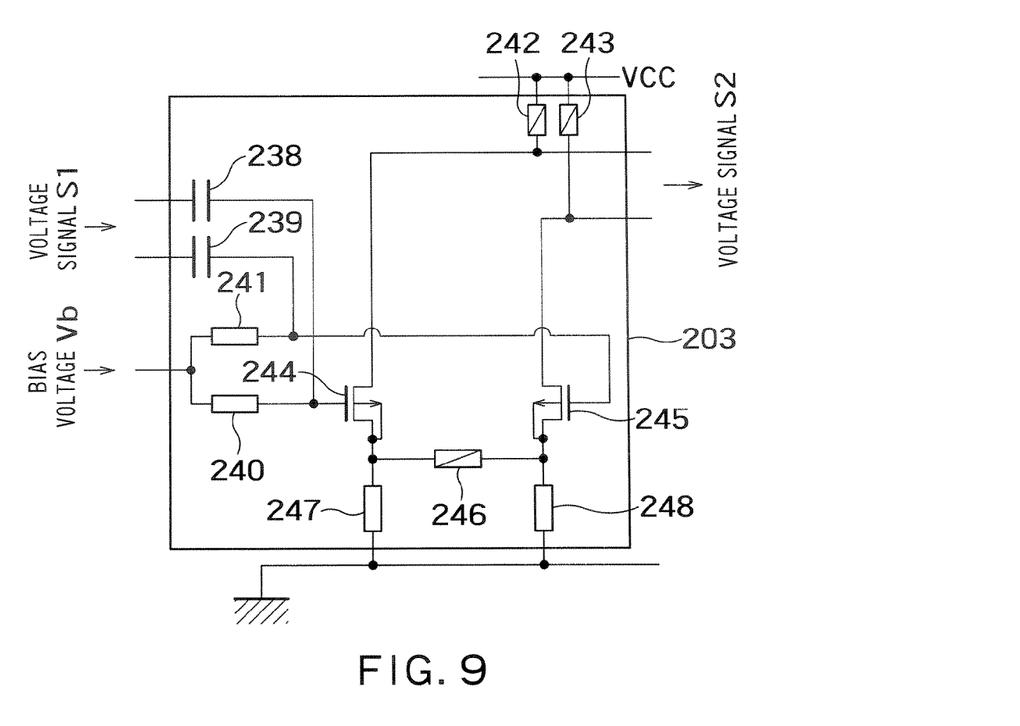
FIG. 9 is a block diagram illustrating a differential amplifier in the differential amplifying system according to the second embodiment, or an aspect, of the present invention.

FIG. 9 is a block diagram illustrating a differential amplifier in the differential amplifying system according to the second embodiment, or an aspect, of the present invention.

As shown in FIG. 9, the differential amplifier 203 includes DC cut capacitors 238 and 239 connected to the input terminals 1a and 1b, respectively, a feed resistor 240 connected between the DC cut capacitor 238 and an input of the bias voltage Vb (or the source of the n-type MOS transistor 232), and a feed resistor 241 connected between the DC cut capacitor 239 and the input of the bias voltage Vb (or the source of the n-type MOS transistor 232).

The differential amplifier 203 also includes an inductor 242 connected to the power source voltage VCC, an inductor 243 connected to the power source voltage VCC, an n-type MOS amplifier transistor 244 whose drain is connected to the inductor 242 and whose gate is connected to the resistor 240, an n-type MOS amplifier transistor 245 whose drain is connected to the inductor 243 and whose gate is connected to the resistor 241, an inductor 246 connected between a source of the n-type MOS amplifier transistor 244 and a source of the n-type MOS amplifier transistor 245, a bias resistor 247 connected between the source of the n-type MOS amplifier transistor 244 and the ground voltage, and a bias resistor 248 connected between the source of the n-type MOS amplifier transistor 245 and the ground voltage.

In the same way as described with respect to the first embodiment, the bias voltage Vb supplied from the bias circuit 206 is supplied to the gates voltages of the respective n-type MOS amplifier transistors 244 and 245 through the feed resistors 240 and 241, respectively. When the compensating current Ic is increased with the increase of the amplitude of the voltage signal S1, gate voltages at the respective n-type MOS amplifier transistors 244 and 245 are raised to thereby increase drain current of the n-type MOS amplifier transistors 244 and 245, that is, idle current of the differential amplifier 203.

In other words, when the bias circuit 206 raises the bias voltage Vb with the increase of the compensating current Ic, the differential amplifier 203 then increases the bias value to be added to the inputted voltage signal, with the increase of the bias voltage Vb.

As in the first embodiment, the differential amplifying system having the configuration and function as described above, supplies the bias voltage Vb corresponding to the signal amplitude detected by the amplitude detection circuit 204, to the differential amplifier 203. Further, the differential amplifying system controls the compensating current Ic to be supplied to the bias circuit 206 by changing the current mirror ratio of the current mirror circuit 216, so that the distortion after the change of the mirror ratio can be suppressed.

In this way, the differential amplifying system is enabled to retain high linearity in a large-signal operation while reducing the electrical power consumption.

As described above, according to the differential amplifying system of the present embodiment, the distortion characteristics of the output signal can be optimized and at the same time the electrical power consumption in the circuit can be reduced.

It should be appreciated that, in the second embodiment described above, the same effects can be attained by using reverse conductive type MOS transistors for the respective transistors and by reversing the polarity.

What is claimed is:

1. A differential amplifying system comprising:
    a differential amplifier for amplifying a voltage signal inputted from an input terminal and outputting the amplified voltage signal through an output terminal;
    an amplitude detection circuit for detecting an amplitude of said voltage signal inputted to said differential amplifier and outputting a detected current corresponding to the amplitude;

a compensation circuit having: a current mirror circuit for outputting a compensating current at a desired mirror ratio for an input of said detected current; and a feedback circuit for changing a mirror ratio of said current mirror circuit in order to control a magnitude of the compensating current according to an amplitude of the voltage signal detected by said amplitude detection circuit; and a bias circuit for supplying bias voltage to said differential amplifier in order to add a bias value to inputted said voltage signal based on the magnitude of said compensating current.

2. The differential amplifying system according to claim 1, wherein:

said feedback circuit changes the mirror ratio of said current mirror circuit so as to limit said compensating current in case said detected current corresponding to the amplitude of said voltage signal, which is smaller than a reference amplitude, is inputted.

3. The differential amplifying system according to claim 1, wherein:

said current mirror circuit has a first transistor to which said detected current is inputted, a second transistor through which current flows at a first mirror ratio for current flowing through the first transistor, and a third transistor through which current flows at a second mirror ratio for current flowing through said first transistor, and outputs said compensating current including currents flowing through said second and third transistors; and said feedback circuit controls the current flowing through said third transistor based on the magnitude of said detected current.

4. The differential amplifying system according to claim 3, wherein:

said feedback circuit limits the current flowing through said third transistor in case said detected current corresponding to the amplitude of said voltage signal, which is smaller than a reference amplitude, is inputted, so that said compensating current is limited.

5. The differential amplifying system according to claim 3, wherein:

said first to third transistors are bipolar transistors; and said feedback circuit has a fourth transistor that is a bipolar transistor whose base is connected to a base of said first transistor, a fifth transistor that is a bipolar transistor whose one end is connected to one end of the fourth transistor and whose the other end is connected to one end of said third transistor, and a sixth transistor that is a bipolar transistor whose base is connected to a base of the fifth transistor and whose one end is connected to said one end of the third transistor.

6. The differential amplifying system according to claim 3, wherein:

said first to third transistors are MOS transistors; and said feedback circuit has a fourth transistor that is a MOS transistor whose gate is connected to a gate of said first transistor, a fifth transistor that is a MOS transistor whose one end is connected to one end of the fourth transistor and whose the other end is connected to one end of said third transistor, and a sixth transistor that is a MOS transistor whose gate is connected to a gate of the fifth transistor and whose one end is connected to said one end of the third transistor.

7. The differential amplifying system according to claim 1, wherein:

said bias circuit raises said bias voltage with the increase of said compensating current; and said differential amplifier increases said bias value with the rise of said bias voltage.

8. The differential amplifying system according to claim 3, wherein said first to third transistors are bipolar transistors.

9. The differential amplifying system according to claim 3, wherein said first to third transistors are any one of MOS transistors, compound FETs or compound HBTs.

* * * * *